(12) United States Patent
Hardy et al.

(10) Patent No.: US 7,551,509 B2
(45) Date of Patent: Jun. 23, 2009

(54) POWER CIRCUITS FOR REDUCING A NUMBER OF POWER SUPPLY VOLTAGE TAPS REQUIRED FOR SENSING A RESISTIVE MEMORY

(75) Inventors: Trevor Hardy, Wichita, KS (US); Steve Porter, Boise, ID (US); Ethan Williford, Boise, ID (US); Mark Ingram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/076,519

(22) Filed: Mar. 19, 2008

(65) Prior Publication Data

US 2008/0170453 A1 Jul. 17, 2008

Related U.S. Application Data

(62) Division of application No. 11/643,689, filed on Dec. 22, 2006, now Pat. No. 7,366,045, which is a division of application No. 11/129,315, filed on May 16, 2005, now Pat. No. 7,269,079.

(51) Int. Cl.
*G11C 5/14* (2006.01)
(52) U.S. Cl. ........................ 365/226; 365/228
(58) Field of Classification Search ................. 365/226, 365/228, 189.09
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |

(Continued)

FOREIGN PATENT DOCUMENTS

JP 5-6126916 10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

(Continued)

*Primary Examiner*—Vu A Le
(74) *Attorney, Agent, or Firm*—Dickstein Shapiro LLP

(57) ABSTRACT

A resistive memory device requires a power supply having a reduced number of voltage taps and reduced power consumption. In accordance with one exemplary embodiment, one or more voltages used by a reference circuit which are normally supplied by different taps of a power supply are generated by corresponding power circuits. In accordance with a second exemplary embodiment, the power circuits are coupled to the bit lines and replace the reference circuit in a manner to improve sensing margin.

20 Claims, 9 Drawing Sheets

U.S. PATENT DOCUMENTS

| | | |
|---|---|---|
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,069,828 A | 5/2000 | Kaneko et al. |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,345,006 B1 | 2/2002 | Ingalls et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |

| | | |
|---|---|---|
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowery |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 7,151,688 B2 | 12/2006 | Williford et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5I: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Fims 97 (1982) 165-171.

Bernede, J.C.; Khelil, A.; Kettaf, M.; Conan, A., Transition from S-to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4I5, Solid State Ionics 70/71 (1994) 72-76.

Boolchand, P., The Maximum in Glass Transition Temperature (Tg) Near x=1/3 in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B,. Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P., Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 200 (1997) 249-253.

Cohen, M.H., Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R.; Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).
Hilt, Dissertation: *Materials Characterization of Silver Chalcogenide Programmable Metalization Cells*, Arizona State University, pp. Title p. 114 (UMI Company, May 1999).
Hirose et al., *High Speed Memory Behavior and Reliability of an Amorphous $As_2S_3$ Film Doped with Ag*, Phys. Stat. Sol. (a) 61, pp. 87-90 (1980).
Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.
Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).
Hong, K.S.; Speyer, R.F., Switching Behavior in II-IV-V2 Amorphous Semiconductor Systems, J. Non-Cryst. Solids 116 (1990) 191-200.
Hosokawa, S., Atomic and Electronic Structures of Glassy GexSe1-x Around the Stiffness Threshold Composition, J. Optoelectronics and Advanced Materials 3 (2001) 199-214.
Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.
Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.
Hu, J.; Snell, A.J.; Hajto, J.; Owen, A.E., Current-induced Instability in Cr-p+a-Si:H-V Thin Film Devices, Phil. Mag. B 80 (2000) 29-43.
Huggett et al., Development of Silver Sensitized Germanium Selenide Photoresist by Reactive Sputter Etching in SF6, 42 Appl. Phys. Lett., No. 7, pp. 592-594 (Apr. 1983).
Iizima, S.; Sugi, M.; Kikuchi, M.; Tanaka, K., Electrical and Thermal Properties of Semiconducting Glasses As-Te-Ge, Solid State Comm. 8 (1970) 153-155.
Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.
Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.
Jones, G.; Collins, R.A., Switching Properties of Thin Selenium Films Under Pulsed Bias, Thin Solid Films 40 (1977) L15-L18.
Joullie, A.M.; Marucchi, J., On the DC Electrical Conduction of Amorphous As2Se7 Before Switching, Phys. Stat. Sol. (a) 13 (1972) K105-K109.
Joullie, A.M.; Marucchi, J., Electrical Properties of the Amorphous Alloy As2Se5, Mat. Res. Bull. 8 (1973) 433-441.
Kaplan, T.; Adler, D., Electrothermal Switching in Amorphous Semiconductors, J. Non-Cryst. Solids 8-10 (1972) 538-543.
Kawaguchi et al., *Mechanism of Photosurface Deposition*, 164-166 J. Non-Cryst. Solids, pp. 1231-1234 (1993).
Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.
Kawaguchi, T.; Masui, K., Analysis of Change in Optical Ttransmission Spectra Resulting from Ag Photodoping in Chalcogenide Film, Japn. J. Appl. Phys. 26 (1987) 15-21.
Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.
Kawasaki, M.; Kawamura, J.; Nakamura, Y.; Aniya, M., Ionic Conductivity of Agx(GeSe3)1-x ($0<=\chi<=0.571$) Glasses, Solid State Ionics 123 (1999) 259-269.
Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.
Kolobov, A.V., On the Orgin of P-type Conductivity in amorphous Chalcogenides, J. Non-Cryst. Solids 198-200 (1996) 728-731.
Kolobov, A.V., Lateral Diffusion of Silver in Vitreous Chalcogenide Films, J. Non-Cryst. Solids 137-138 (1991) 1027-1030.
Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.
Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.
Kozicki et al., Silver Incorporation in Thin films of Selenium Rich Ge-Se Glasses, International Congress on Glass, vol. 2, Extended Abstracts, Jul. 2001, pp. 8-9.
Michael N. Kozicki, 1. Programmable Metallization Cell Technology Description, Feb. 18, 2000.
Michael N. Kozicki, Axon Technologies Corp. and Arizona State University, Presentation to Micron Technology, Inc., Apr. 6, 2000.
Kozicki et al., Applications of Programmable Resistance Changes In Metal-doped Chalcogenides, Electrochemical Society Proceedings, vol. 99-13, 1999, pp. 298-309.
Kozicki et al., Nanoscale Effects in Devices Based on Chalcogenide Solid Solutions, Superlattices and Microstructures, vol. 27, No. 5/6, 2000, pp. 485-488.
Kozicki et al., Nanoscale Phase Separation in Ag-Ge-Se Glasses, Microelectronic Engineering 63 (2002) pp. 155-159.
Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.
Lal, M.; Goyal, N., Chemical Bond Approach to Study the Memory and Threshold Switching Chalcogenide Glasses, Indian Journal of Pure & Appl. Phys. 29 (1991) 303-304.
Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.
Leung, W.; Cheung, N.; Neureuther, A.R., Photoinduced Diffusion of Ag in GexSe1-x Glass, Appl. Phys. Lett. 46 (1985) 543-545.
Matsushita, T.; Yamagami, T.; Okuda, M., Polarized Memory Effect Observed on Se-SnO2 System, Jap. J. Appl. Phys. 11 (1972) 1657-1662.
Matsushita, T.; Yamagami, T.; Okuda, M., Polarized Memory Effect Observed on Amorphous Selenium Thin Films, Jpn. J. Appl. Phys. 11 (1972) 606.
Mazurier, F.; Levy, M.; Souquet, J.L, Reversible and Irreversible Electrical Switching in TeO2-V2O5 Based Glasses, Journal de Physique IV 2 (1992) C2-185-C2-188.
McHardy et al., The Dissolution of Metals in Amorphous Chalcogenides and the Effects of Electron and Ultraviolet Radiation, 20 J. Phys. C.: Solid State Phys., pp. 4055-4075 (1987).
Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.
Mitkova, M.; Boolchand, P., Microscopic Origin of the Glass Forming Tendency in Chalcohalides and Constraint Theory, J. Non-Cryst. Solids 240 (1998) 1-21.
Mitkova, M.; Kozicki, M.N., Silver Incorporation in Ge-Se Glasses Used in Programmable Metallization Cell Devices, J. Non-Cryst. Solids 299-302 (2002) 1023-1027.
Mitkova, M.; Wang, Y.; Boolchand, P., Dual Chemical Role of Ag as an Additive in Chalcogenide Glasses, Phys. Rev. Lett. 83 (1999) 3848-3852.
Miyatani, S.-y., Electronic and Ionic Conduction in (AgxCu1-x)2Se, J. Phys. Soc. Japan 34 (1973) 423-432.
Miyatani, S.-y., Electrical Properties of Ag2Se, J. Phys. Soc. Japan 13 (1958) 317.
Miyatani, S.-y., Ionic Conduction in Beta-Ag2Te and Beta-Ag2Se, Journal Phys. Soc. Japan 14 (1959) 996-1002.
Mott, N.F., Conduction in Glasses Containing Transition Metal Ions, J. Non-Cryst. Solids 1 (1968) 1-17.
Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.
Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neal, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metallurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x$ ($0 \leq x \leq 0.20$) Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities of Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.KH.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell,A.J.; Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald,A.G.; Owen,A.E., Aspects of Non-volatility in a-Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. Of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/ metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H. ;Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. And Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

POWER CIRCUITS FOR REDUCING A NUMBER OF POWER SUPPLY VOLTAGE TAPS REQUIRED FOR SENSING A RESISTIVE MEMORY

This application is a divisional application of U.S. Application Ser. No. 11/643,689, filed Dec. 22, 2006 now U.S. Pat. No. 7,366,045, which is a divisional application of U.S. Application Ser. No. 11/129,315, filed May 16, 2005, now U.S. Pat. No. 7,269,079, issued Sep. 11, 2007, the content of which is incorporated herein by reference.

FIELD OF INVENTION

The present invention relates generally to resistive memories. More specifically, the present invention relates to a method and apparatus for eliminating a power supply tap for supplying one or more reference voltages ordinarily used for sensing the state of a resistive memory cell.

BACKGROUND OF THE INVENTION

FIG. 1 is an illustration of a resistive memory cell 100 in relationship to a bit line 121, a word line 122, and a cell plate 110. The resistive memory cell 100 includes an access transistor 101 having one source/drain coupled to the bit line 121, a gate coupled to the word line 122, and another source/drain coupled to a bi-stable resistive material element 102. The bi-stable resistive material element 102 is also coupled a cell plate 110, which is typically shared among a plurality of resistive memory cells 100. The cell plate 110 is also coupled to a source of cell plate voltage designated as CPIN.

The bi-stable resistive material 102 can be any type of material that can be set to at least two different resistive states. The memory cell 100 may be classified based on the type of bi-stable resistive material 102. For example, in programmable conductor random access memory (PCRAM) cell the bi-stable resistive material 102 is typically a type of chalcogenide glass, while MRAM cells, phase-change cells, polymer memory cells, and other types of resistive memory cells employ other corresponding types of bi-stable resistive material 102.

By way of example, the illustrated resistive memory cell 100 is a PCRAM cell, in which the bi-stable resistive material element 102 may be respectively set to a first resistive state (e.g., approximately 10 K ohm) or a second resistive state (e.g., approximately 10 M ohm), via a first programming voltage (e.g. approximately 0.25 volt) and a second programming voltage (e.g., approximately −0.25 volt). The resistive memory cell 100 may be read by pre-charging the bit line 121 to a predetermined voltage while the access transistor 101 is non-conducting, and then causing the access transistor 101 to become conducting, thereby discharging the bit line 121 through the resistive memory cell 100 to the cell plate 110 for a predetermined time. If the voltage across the bi-stable resistive material 102 is of a magnitude less than the magnitude of the programming voltages, the read process will not alter the state of the bi-stable resistive material 102. The discharge rate is based on the state of the bi-stable resistive material 102.

A combination of cell plate voltage, bit line pre-charge voltage, and bi-stable resistive material 102 resistance may be chosen such that, when discharged, bit line 121 can be sensed using sensing circuits. Typically each sensing circuit is also coupled to a reference bit line, which is charged to a predetermined voltage. The predetermined voltage is set to an intermediate value between the two possible voltages of the bit line 121 being associated with the memory cell being read. The operation of the sensing circuit pulls the bit line having the higher voltage to an even higher voltage and pulls the bit line having the lower voltage down to a lower voltage (e.g., ground). Thus, after the operation of the sensing circuit, a comparator coupled to both bit lines can be used to output a digital signal corresponding to the state of the memory cell being read.

FIGS. 2A and 2B illustrate examples of portions of two resistive memory devices 200. Each memory device 200 includes a plurality of resistive memory cells 100, organized into an array by a plurality of word lines 122a-122f and a plurality of bit lines 121a-121d. Each word line (generally referred to by numeral 122) and each bit line (generally referred to by numeral 121) are identical. The alphanumeric suffixes at the end of each word line 122 and bit line 121 are for distinguishing between individual word lines 122 and bit lines 121 in FIGS. 2A and 2B.

Due to space limitations, only a limited number of word lines 122, bit lines 121, and memory cells 100 are illustrated. However, it should be appreciated that actual memory devices typically include many more word lines 122, bit lines 121, and cells 100. FIGS. 2A and 2B also illustrate a plurality of sensing circuits 300, which are used for reading information stored in the memory cells 100.

FIG. 2A is an illustration of an open architecture, where each sensing circuit 300 is associated with two bit lines (e.g., bit lines 121a and 121b) each associated with a different memory array 210. In contrast, FIG. 2B is an illustration of a folded architecture, where each sensing circuit 300 is still associated with two bit lines (e.g., 121a, 121b). However, in FIG. 2B these two bit lines are associated with alternating (i.e., odd/even) memory cells 100 of a same memory array 210.

FIG. 3 is a more detailed illustration of a sensing circuit 300. The sensing circuit 300 includes an equalization circuit 310, a reference setting circuit 320, a switching circuit 330, and a sense amplifier 340. A multi-tap power supply 360 provides power at Veq, DVC2, Vref, and Vcc voltage levels to the sensing circuit 300. A control circuit 350 provides control signals EQ, REFE, REFO, and SA_ISO to the sensing circuit 300. The use of these voltages and control signals are described in greater detail below.

The equalization circuit 310 includes two input nodes A1 and A2, each coupled to a respective bit line 121. One of the two bit lines 121 is a bit line connected to a memory cell 100 which will be read. The other bit line is another bit line 121 which is coupled to the same sensing circuit 300 as the bit line connected to the memory cell to be read. For the description below, it is assumed that bit line 121a is coupled to node A1 and is the bit line connected to the memory cell 100 to be read, while bit line 121b is coupled to node A2 and is the other bit line (also known as the reference bit line). However, one skilled in the art would recognize that the roles of the bit lines may be changed depending on which memory cell is being read. The equalization circuit 310 also includes two output nodes A3 and A4, which are respectively coupled to input nodes A5 and A6 of the reference setting circuit 320. Additionally, the equalization circuit 310 accepts, from a control circuit 350 the EQ control signal at node C1. In addition, the equalization circuit 310 accepts the equalization voltage Veq voltage at node P1.

The function of the equalization circuit 310 is to equalize the voltages of the bit lines 121a, 121b respectively coupled to nodes A1, A2 to the Veq voltage level. The sense process performed by the sensing circuit 300 begins with the operation of the equalization circuit 310, in which the EQ control signal, which is typically asserted low, is temporarily asserted high. While the EQ control signal is asserted high, bit lines 121a and 121b are coupled to each other and also coupled to the Veq voltage. After a short time, both bit lines are charged to the Veq voltage. The EQ control signal is then returned to a low state, thereby decoupling bit lines 121a and 121b from each other and from the Veq voltage. The parasitic capacitance on the bit lines 121a, 121b holds the bit line voltage at the Veq level.

The reference setting circuit 320 is used to change the voltage on one of the two bit lines 121a, 121b from the Veq voltage to a predetermined voltage Vref. The control circuit 350 temporarily asserts high one of control signals REFE (at node C2) and REFO (at node C3) to select the bit line having the memory cell 100 to be read as the bit line for changing the voltage. The reference setting circuit 320 also accepts power at the DVC2 (at node P2) and Vref (at node P3) voltages.

The isolation circuit 330, is a switch for controllably coupling or decoupling the sense amplifier 340 from the reference setting circuit 320, and the from the bit lines coupled to nodes A1 and A2. The isolation circuit 320 accepts the SA_ISO control signal, which is normally asserted low to isolate the sense amplifier 340 from the reference setting circuit 320.

After the reference setting circuit 320 has set bit line 121b to the predetermined voltage Vref, and while the SA_ISO control signal is asserted low, the word line 122 associated with the memory cell 100 to be read is asserted high for a predetermined time and then asserted low. During the predetermined time, the access transistor 101 of the memory cell 100 is set to a conductive state, thereby causing the bit line 121a associated with the memory cell 100 being read to discharge through the cell plate 110. As a result, the bit line 121a associated with the memory cell 100 being read is now at a lower voltage. Depending upon the state of the memory cell 100, the lower voltage is either at a first lower voltage which is higher in voltage than the Vref voltage, or a second lower voltage which is lower in voltage than the Vref voltage.

The SA_ISO control signal is then asserted high to couple the sense amplifier 340 to both bit lines 121a, 121b. The sense amplifier 340 is also respectively coupled to a Vcc power supply voltage and a ground potential voltage at nodes P4 and P5. Bit line 121a has either a slightly higher or lower voltage than bit line 121b, based on the state of memory cell 100. The sense amplifier 340 magnifies the voltage difference by pulling the lower voltage bit line to ground and pulling the higher voltage bit line to a higher voltage. When the sense amplifier has completed this operation, a comparator (not illustrated) associated with the sense amplifier 340 can be used to output a high or low logical state corresponding to the state of the memory cell 100 at node O1.

As described above, the sensing circuit 300 is coupled to a variety of voltages supplied by a power supply. These include the Veq, DVC2, Vref, and Vcc voltages. The requirement to provide each additional voltage from a power supply 360 makes the power supply more complicated. Accordingly, there is a need and desire to reduce the number of power supply taps required by the sensing circuit of a resistive memory, thereby reducing power consumption.

SUMMARY OF THE INVENTION

Exemplary embodiments of the method and apparatus of the present invention provide for reducing the number of power supply taps required to sense a resistive memory. In accordance with one exemplary embodiment, one or more voltages used by a reference circuit which are normally supplied by different taps of a power supply are generated by corresponding power circuits. In accordance with a second exemplary embodiment, the power circuits are coupled to the bit lines and replace the reference circuit.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 1:
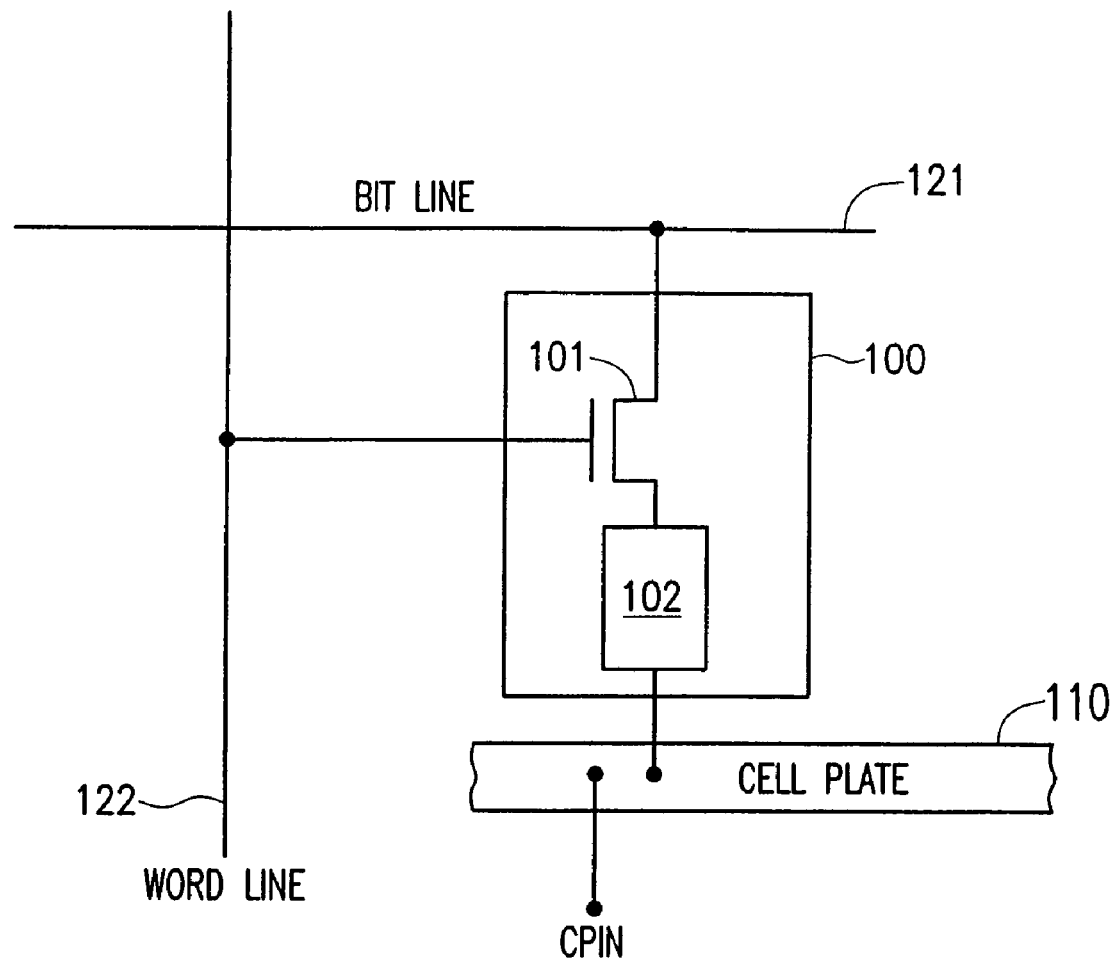
FIG. 1 illustrates a resistive memory cell.
Figure 2A:
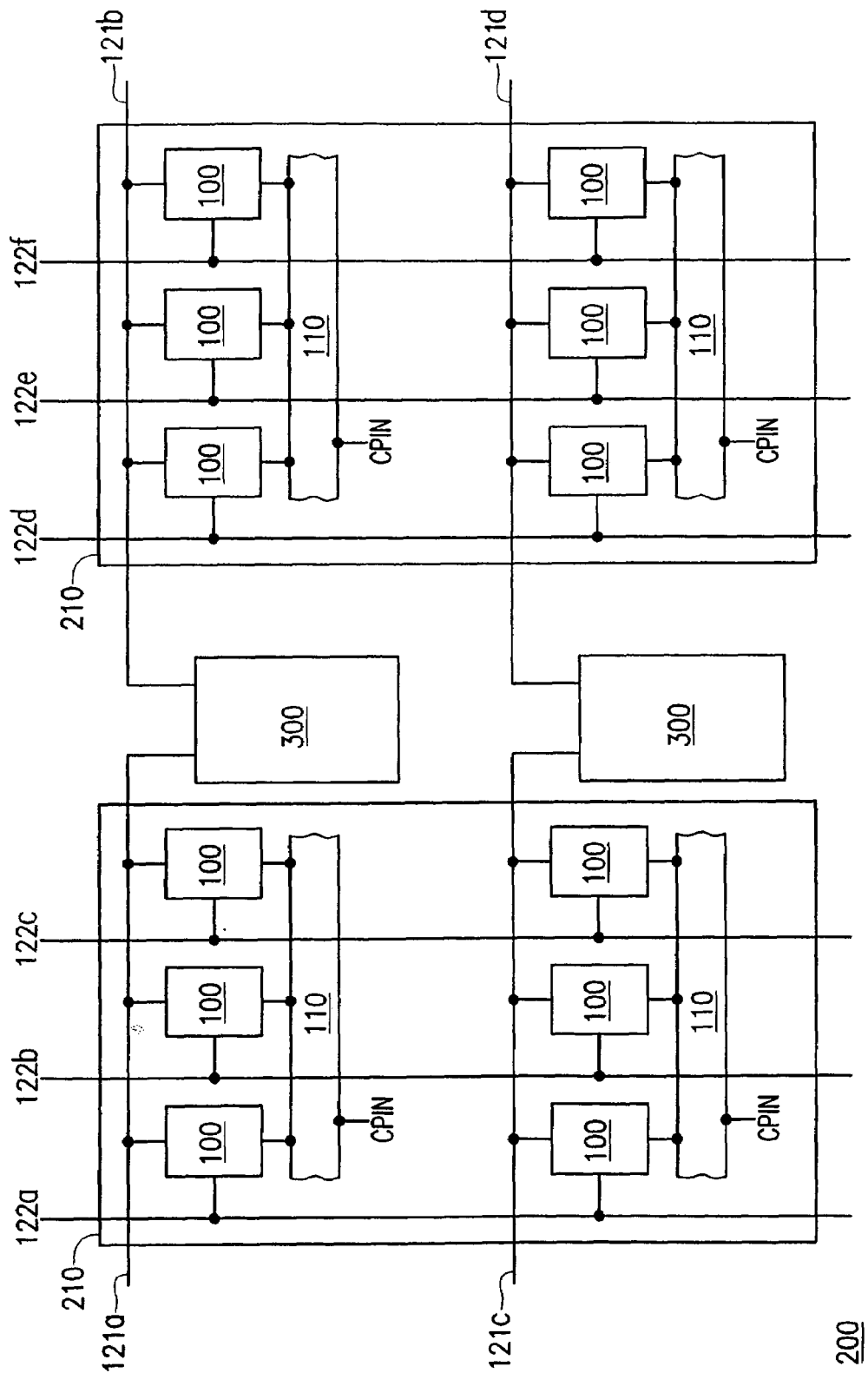
FIG. 2A illustrates a first example of a portion of a resistive memory device.
Figure 2B:
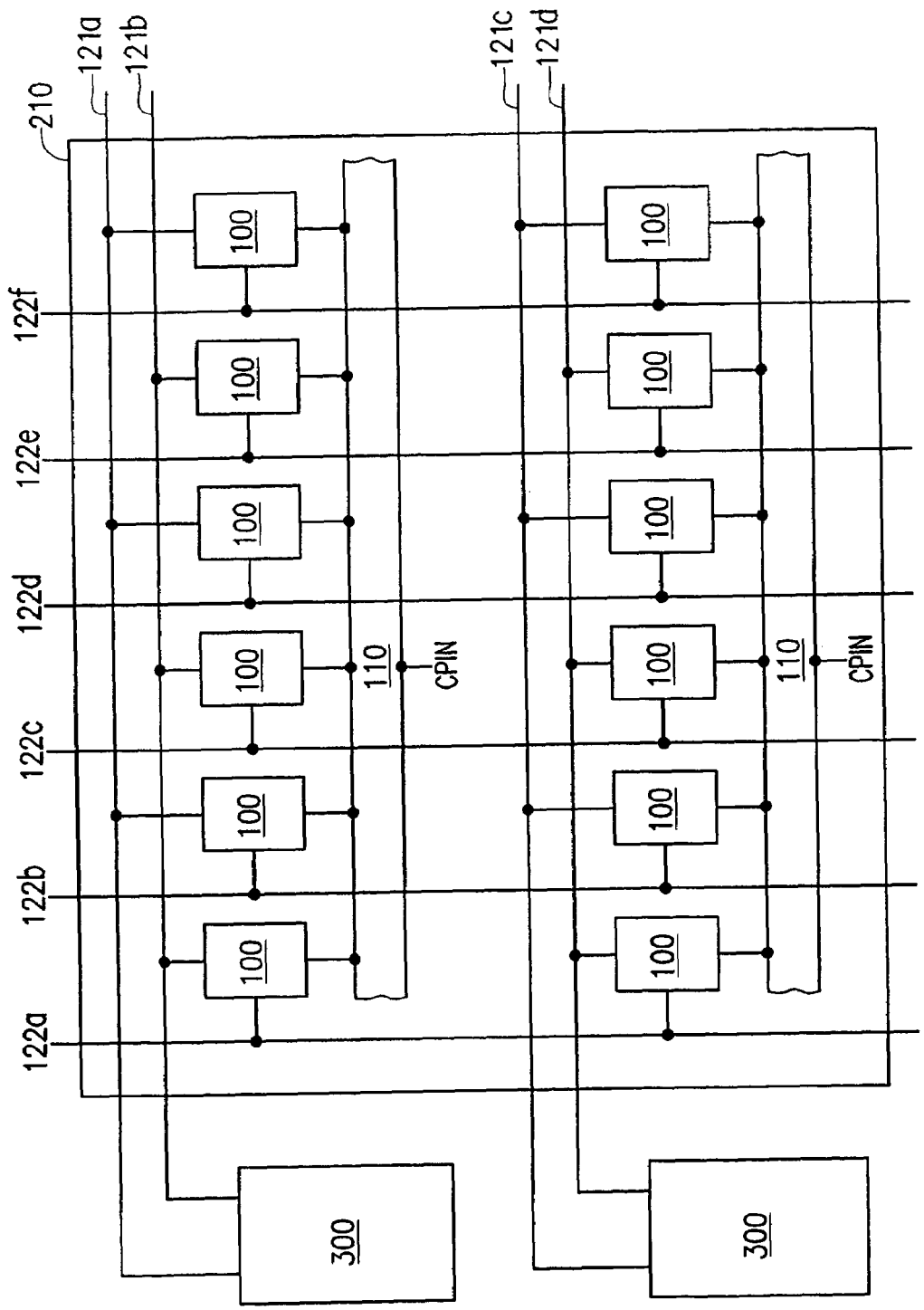
FIG. 2B illustrates a second example of a portion of a resistive memory device.
Figure 3:
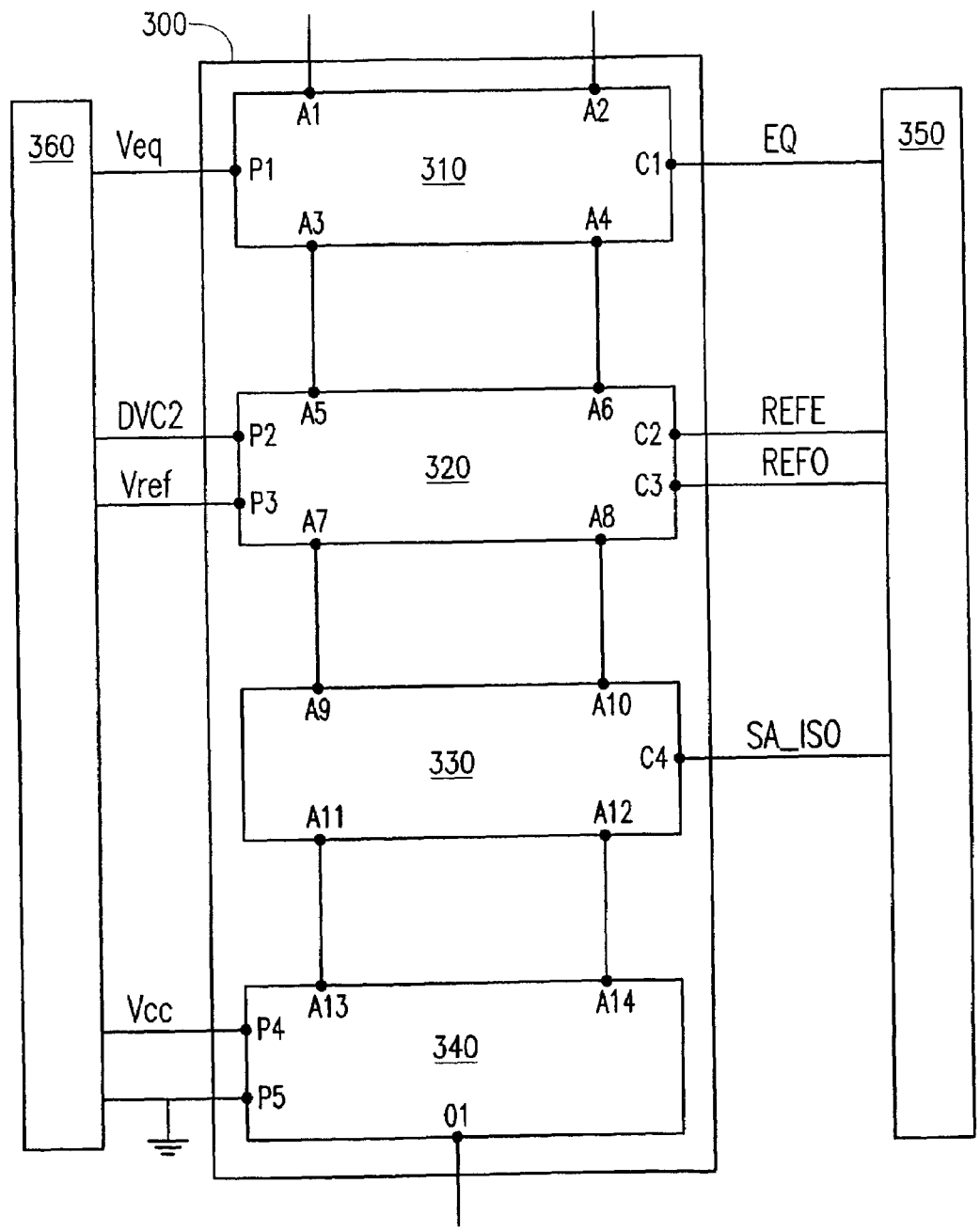
FIG. 3 illustrates a sensing circuit, including its equalization circuit, reference setting circuit, isolation circuit, and sense amplifier components.
Figure 4:
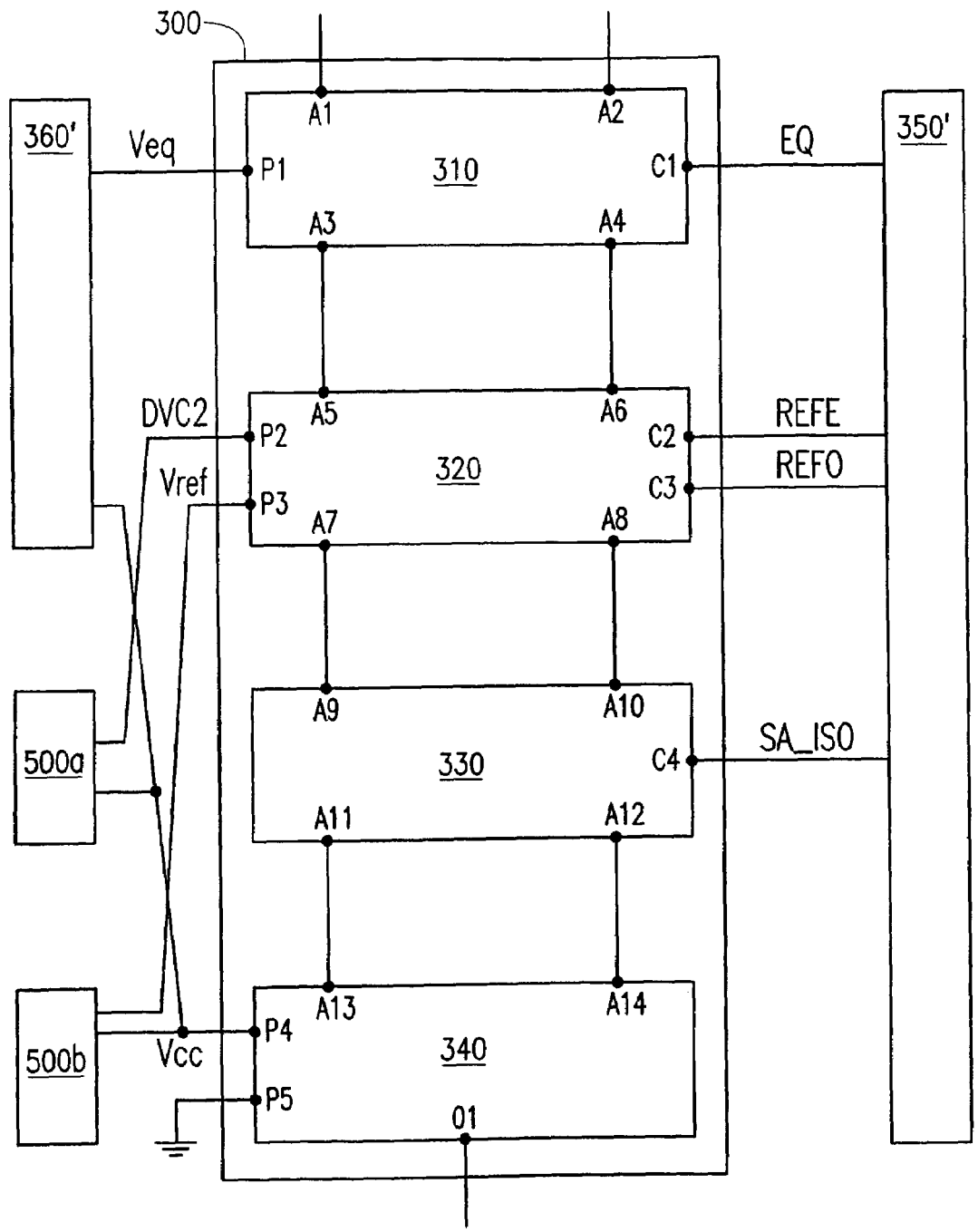
FIG. 4 illustrates a first exemplary embodiment of the present invention, including a sensing circuit and two power circuits.

Now referring to the drawings, where like reference numerals designate like elements, there is shown in FIG. 4, a first exemplary embodiment of the present invention. FIG. 4 illustrates a sensing circuit 300, a control circuit 350, a modified power supply 360' and two power circuit 500a, 500b. The sensing circuit 300 of FIG. 4 is identical to the sensing circuit 300 of FIG. 3. The control circuit 350', however, is a modified version of the control circuit 350 of FIG. 3, and is discussed in greater detail below with respect to FIG. 7. The power supply 360' may be a simplified power supply, which does not supply the Vref or DVC2 voltages described above, as these voltages are now respectively generated by power circuits 500a, 500b.

Figure 5A:
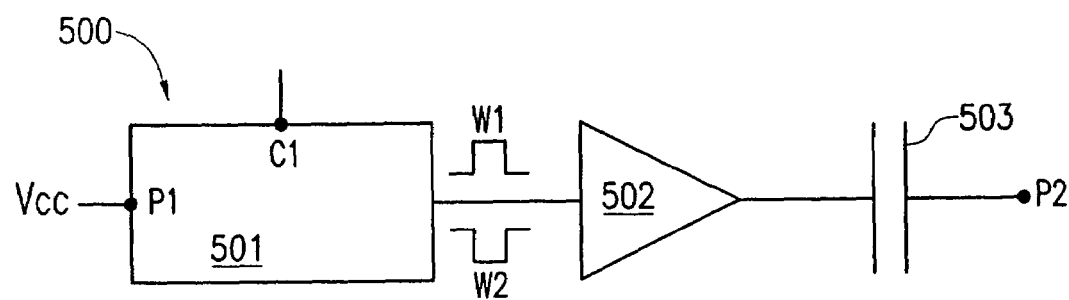
FIGS. 5A and 5B illustrate two exemplary embodiments of the power circuits of FIG. 4.
Figure 5B:
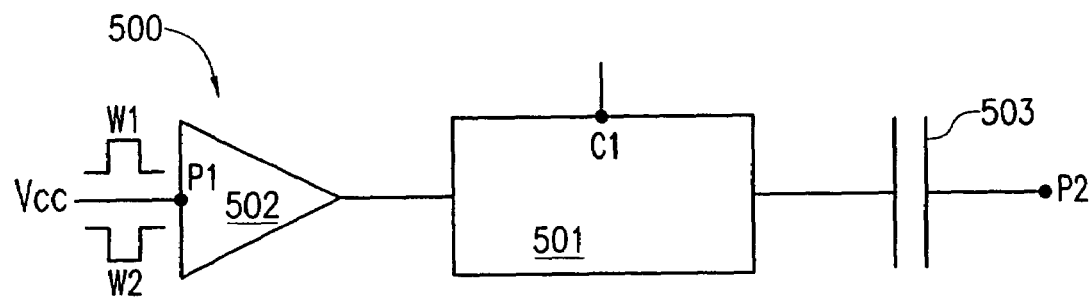

FIGS. 5A and 5B respectively illustrate a first and second embodiments of the two power circuits 500a, 500b (denoted generally by numeral 500). As will be evident from the description of each embodiment, each power circuit 500 can be configured to generate different voltages. For example, the same power circuit 500 can be configured to generate the DVC2 or Vref voltages.

In FIG. 5A, a control circuit 501 receives power in the form of the Vcc voltage at node P1. The control circuit 501 also receives one or more control signals at node C1. Responsive to the one or more control signals asserted at node C1, the control circuit 501 creates either a positive magnitude pulse W1 or a negative magnitude pulse W2. Pulses W1 or W2 are output from the control circuit 501 and received by a driver 502, which is used to charge a capacitor 503. By varying the magnitude and/or pulse width, and/or by selecting between a positive W1 or negative W2 magnitude pulse, in response to the state of the control signal(s) received at node C1, the control circuit 501 can cause the driver 502 to charge capacitor 503 with different levels of charge, thereby configuring the capacitor 503 to couple either the Vref, DVC2, or any other desired voltage at node P2. In one exemplary embodiment, the cell plate of the resistive memories are maintained at 1.2 volts, the DVC2 voltage is 1.0 volt, and the Vref voltage is 1.1 volts. However, it should be recognized that the invention may be practiced using different voltage parameters.

The pulse width and/or magnitude of the pulses may be varied to change the total amount of charge transferred by the driver 502 to the capacitor 503, thereby changing the magnitude of the voltage coupled to P2. Similarly, by permitting the control circuit 501 to produce either a positive going pulse W1 or a negative going pulse W2, the voltage at P2 can be used to either pull up or down the existing bit line voltage. The parameters for the pulse width, pulse magnitude, and the selection between a positive going W1 or negative going W2 pulse may be performed by asserting the appropriate control signals at node C1. Since many of these parameters are process dependent, they may vary for each memory chip. Thus, a memory device incorporating the invention may include a calibration circuit that calibrates the pulse parameters during start-up and/or reset.

In FIG. 5B, the order of the control circuit 501 and the driver 502 are reversed. The driver 502 is supplied a positive going W1 or negative going W2 pulse of the Vcc voltage, which is then supplied to a control circuit 501. As with the embodiment of FIG. 5A, the control circuit 501 accepts one or more control signals at node C1. Because there is no driver stage between control circuit 501 and the capacitor 503, the control circuit 501 of FIG. 5B is more limited in its capabilities in comparison to the circuit 501 of FIG. 5A. However, the circuit 501 in FIG. 5B can be used to trim the magnitude or pulse width of the pulses W1, W2, thereby reducing the magnitude of the voltage output at node P2.

Figure 6:
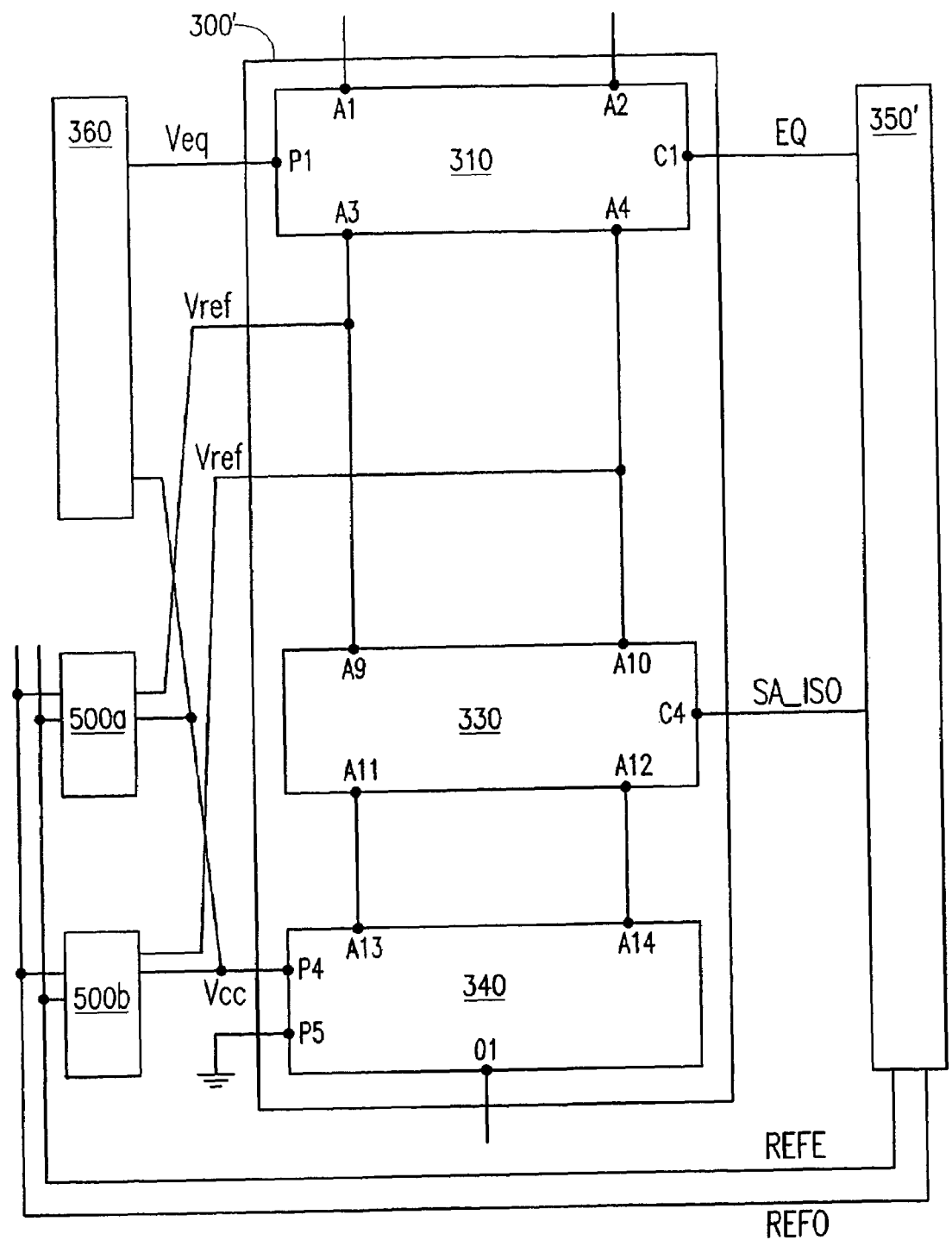
FIG. 6 illustrates a second exemplary embodiment of the present invention, including a modified sensing circuit and two power circuits.

FIG. 6 is an illustration of a sensing circuit 300' according to another exemplary embodiment of the invention. More specifically, in FIG. 6, the sensing circuit 300 of FIG. 5 has been replaced with a modified sensing circuit 300'. The modified sensing circuit 300' differs from the sensing circuit 300 of FIGS. 3-4 in that the reference setting circuit 320 (FIGS. 3-4) has been eliminated. As a result, the equalization circuit 310 now directly couples to the isolation circuit 330. Power circuits 500a, 500b are now respectively coupled to one of the two bit lines associated with the sensing circuit 300'. The control circuit 350' is a modified version of the control circuit 350 (FIG. 3), and is discussed in greater detail below with respect to FIG. 7.

The power circuits 500a, 500b are now also coupled to the REFE and REFO control signals. In the illustrated configuration, the power circuits 500a and 500b are respectively being used to generate voltages which will be coupled to both bit lines. For example, power circuit 500a can be configured via control signals REFE and REFO to set a particular a bit line (e.g., bit line 121a) to the Vref voltage. At the same time, power circuit 500b can be configured to either idle, if the previously applied Veq voltage is deemed suitable for the forthcoming sensing operation, or to supply a specific voltage to the other bit line (e.g., bit line 121b). The power circuits 500a and 500b of FIG. 6 are essentially identical to the power circuit 500 illustrated by FIGS. 5A and 5B, but require a somewhat more complex control circuit 501 for responding to the REFE and REFO control signals.

Figure 7:
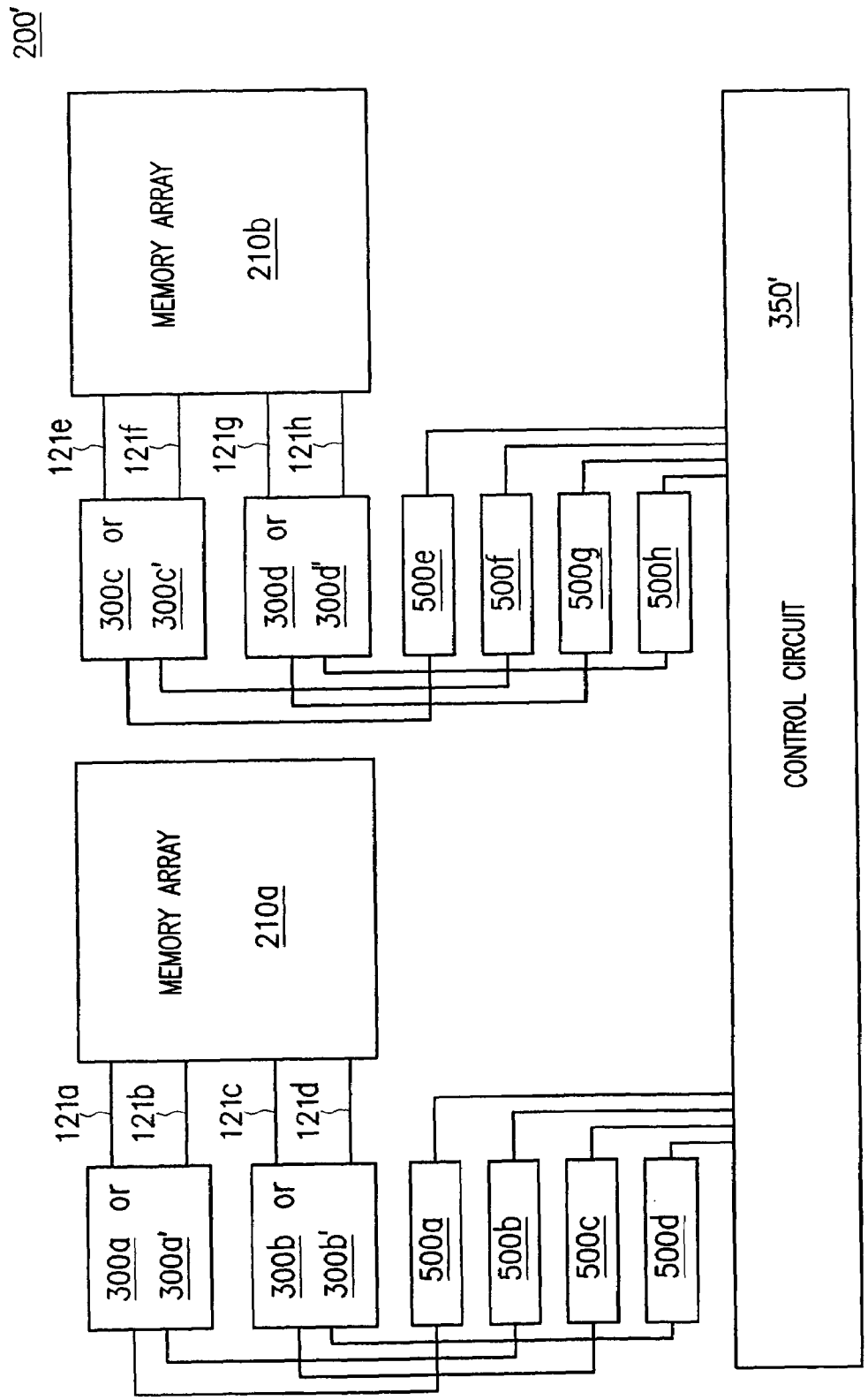
FIG. 7 illustrates an exemplary memory device.

FIG. 7 illustrates in block diagram form the organization of a memory device 200' constructed in accordance with the principles of the invention. The memory device 200' includes a plurality of memory arrays 210a, 210b, sensing circuits 300a/300'a-300d/300'd, and power circuits 500a-500h. More specifically, each array (e.g., 210a) is associated with a respective sensing circuit (e.g., 300a/300a' and 300b/300b'). Each sensing circuit (e.g., 300a/300a') is respectively associated with a pair of power circuits (e.g., 500a and 500b). A single control circuit 350' is used. When processing a read transaction, the control circuit 350' identifies the sensing circuit (e.g., 300a/300a') associated with the cell to be read and activates only the power circuits (e.g., 500a and 500b) associated with that sensing circuit. The memory device 200' also includes a conventional power supply 360' for supplying the Vcc and Veq voltages to the plurality of sensing circuits. However, the conventional power supply 360' and its connections are not illustrated in order to avoid cluttering the figure.

The present invention is therefore directed to the use of one or more power circuits for producing from an existing power supply voltage tap, one or more voltages necessary for sensing the state of the resistive memory cell. More specifically, one or more power circuits are supplied at least one control signal and the Vcc voltage. A pulse train is driven by a driver and controlled by a control circuit to charge a capacitor. The level of charge stored on the capacitor permits the Vcc voltage to generate a variety of voltages, which can subsequently be supplied to various components of a sensing circuit, thereby eliminating the need for the power supply itself to include voltage taps at these voltage levels.

Figure 8:
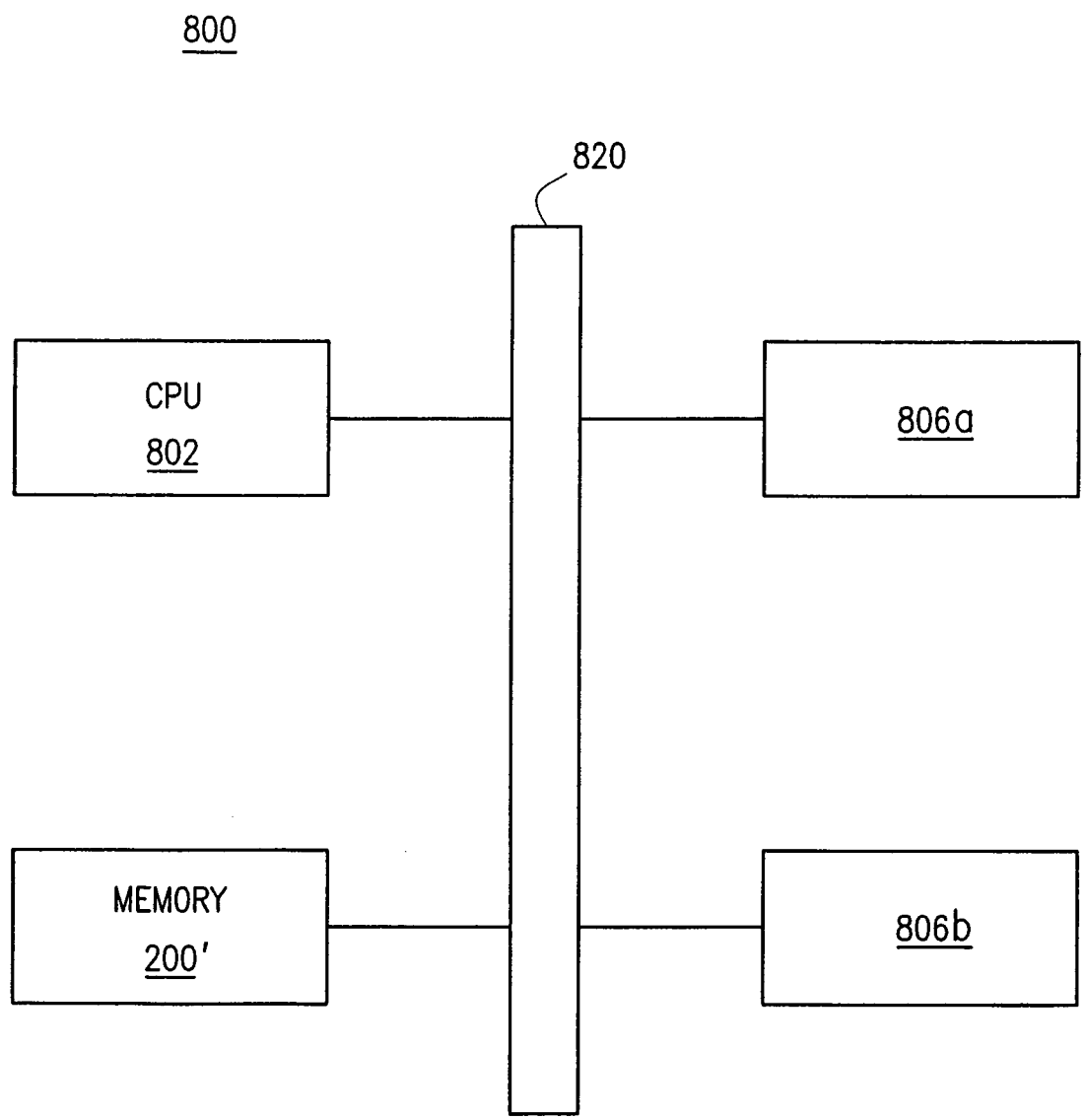
FIG. 8 illustrates a processor based system having a memory device constructed in accordance with the present invention.

FIG. 8 illustrates a processor based system 800. The system 800 is exemplary of a digital system. Without being limited, system 800 could be a part of a computer system, camera, scanner, machine vision system, vehicle or personal navigation system, portable telephone with camera, video phone, surveillance system, auto focus system, optical tracking system, image stabilization system, motion detection system, or other digital system. System 800 generally comprises a bus 820. Coupled to the bus 820 are a processor, such as CPU 802, a memory, such the memory 200' of FIG. 7, and a plurality of I/O device 806a, 806b.

It should be appreciated that other embodiments of the invention include a method of manufacturing the circuit 700. For example, in one exemplary embodiment, a method of manufacturing a power supply circuit include the steps of providing, over a portion of a substrate corresponding to a single integrated circuit, control circuit coupled to a driver, and a capacitor coupled to either the drive or the control circuit.

While the invention has been described in detail in connection with the exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A memory device, comprising:
   a plurality of memory arrays, each array comprising a plurality of bit lines, word lines, and resistive memory cells;
   a plurality of sensing circuits, each associated with every two bit lines of the plurality of memory arrays;
   a power supply, for providing at least a first voltage to the plurality of sensing circuits;
   a plurality of first power circuits, each associated with a respective sensing circuit, and for supplying to each respective sensing circuit a first additional voltage not provided by the power supply; and a control circuit, coupled to each of the first power circuits.

2. The memory device of claim 1, further comprising:
a plurality of second power circuits, each associated with a respective sensing circuit, and for supplying to each respective sensing circuit a second additional voltage not provided by the power supply, the second power circuits being coupled to the control circuit.

3. The memory device of claim 1, wherein the first power circuits comprise:
a pulse control circuit, the pulse control circuit receiving the first voltage and a control signal, the pulse control circuit producing a pulse signal having at least one parameter controllable via the control signal;
a driver, coupled to the pulse control circuit, for driving the pulse signal; and
a capacitor electrically coupled to the driver, for storing charges received from the driven pulse signal and for providing the first additional voltage based on the stored charges.

4. The memory device of claim 3, wherein the at least one parameter includes a pulse width parameter for controlling either the width or magnitude of the pulse signal.

5. The memory device of claim 3, wherein the at least one parameter includes a pulse type parameter for controlling whether the pulse signal is positive or negative in magnitude.

6. The memory device of claim 1, wherein the first power circuits comprise:
a driver, for receiving a pulse signal and driving the pulse signal to a pulse control circuit;
a pulse control circuit, coupled to receive a control signal, the pulse control circuit receiving the driven pulse signal and configured to alter at least one parameter of the driven pulse signal in accordance with a state of the control signal; and
a capacitor electrically coupled to the pulse control circuit, for storing charges received from the altered driven pulse signal, and for providing the first additional voltage based on the stored charges.

7. The memory device of claim 6, wherein the control signal controls a trimming of either the width or voltage magnitude of the driven pulse signal by the pulse control circuit.

8. The memory device of claim 6, wherein the pulse signal, the driven pulse signal, and the altered and driven pulse signal are each all positive or negative in magnitude.

9. A memory device, comprising
a memory array comprising a plurality of bit lines, word lines, and resistive memory cells;
at least one sensing circuit associated with a pair of bit lines of the memory array;
a power supply, for providing at least a main power signal to the at least one sensing circuit;
at least one first power circuit associated with the at least one sensing circuit for supplying the sensing circuit with a first reference power signal not provided by the power supply; and
a control circuit, coupled to the at least one power circuit and adapted to activate at least the power circuit corresponding to a memory cell to be read when processing a read transaction.

10. The memory device of claim 9, wherein the at least one first power circuit comprises:
a pulse control circuit, the pulse control circuit receiving the main power signal and a control signal, the pulse control circuit producing a pulse signal having at least one parameter controllable via the control signal;
a driver, coupled to the pulse control circuit, for driving the pulse signal; and
a capacitor electrically coupled to the driver, for storing charges received from the driven pulse signal and for providing the first reference power signal based on the stored charges.

11. The memory device of claim 10, wherein the at least one parameter includes a pulse width parameter for controlling either the width or magnitude of the pulse signal.

12. The memory device of claim 9, wherein the at least one first power circuit comprises:
a driver, for receiving a pulse signal and driving the pulse signal to a pulse control circuit;
a pulse control circuit, coupled to receive a control signal, the pulse control circuit receiving the driven pulse signal and configured to alter at least one parameter of the driven pulse signal in accordance with a state of the control signal; and
a capacitor electrically coupled to the pulse control circuit, for storing charges received from the altered driven pulse signal, and for providing the first reference power signal based on the stored charges.

13. The memory device of claim 12, wherein the control signal controls a trimming of either the width or voltage magnitude of the driven pulse signal by the pulse control circuit.

14. The memory device of claim 9, further comprising:
at least one second power circuit associated with the at least one sensing circuit for supplying the sensing circuit with a second reference power signal not provided by the power supply, the at least one second power circuit being coupled to the control circuit.

15. The memory device of claim 14, wherein the at least one first power circuit and the at least one second power circuit comprise:
a pulse control circuit, the pulse control circuit receiving the main power signal and a control signal, the pulse control circuit producing a pulse signal having at least one parameter controllable via the control signal;
a driver, coupled to the pulse control circuit, for driving the pulse signal; and
a capacitor electrically coupled to the driver, for storing charges received from the driven pulse signal and for providing the respective first or second reference power signal based on the stored charges.

16. The memory device of claim 14, wherein the at least one first power circuit and the at least one second power circuit comprise:
a driver, for receiving a pulse signal and driving the pulse signal to a pulse control circuit;
a pulse control circuit, coupled to receive a control signal, the pulse control circuit receiving the driven pulse signal and configured to alter at least one parameter of the driven pulse signal in accordance with a state of the control signal; and
a capacitor electrically coupled to the pulse control circuit, for storing charges received from the altered driven pulse signal, and for providing respective first or second reference power signal based on the stored charges.

17. A memory device, comprising:
a memory array comprising a plurality of bit lines, word lines, and resistive memory cells;
at least one sensing circuit associated with a pair of bit lines of the memory array;
a power supply, for providing at least a main power signal and an equalization power signal to the at least one sensing circuit;

at least one first power circuit associated with the at least one sensing circuit for supplying the sensing circuit with a first reference power signal not provided by the power supply; and a control circuit, coupled to the at least one power circuit and adapted to activate at least the power circuit corresponding to a memory cell to be read when processing a read transaction; and wherein the at least one sensing circuit comprises:

an equalization circuit, coupled to the associated pair of bit lines and to the power supply for receiving the equalization power signal, the equalization circuit being configured to set a voltage of the associated pair of bit lines to a voltage of the equalization power signal;

a reference circuit, coupled to the associated pair of bit lines and the respective first power circuit, for receiving the first reference power signal, the reference circuit being configured to set a voltage of one of the associated pair of bit lines to a voltage of the first reference power signal; and a sense amplifier, controllably coupled to the associated pair of bit lines.

18. The memory device of claim 17, wherein the at least one first power circuit comprises:

a pulse control circuit, the pulse control circuit receiving the main power signal and a control signal, the pulse control circuit producing a pulse signal having at least one parameter controllable via the control signal;

a driver, coupled to the pulse control circuit, for driving the pulse signal; and a capacitor electrically coupled to the driver, for storing charges received from the driven pulse signal and for providing the first reference power signal based on the stored charges.

19. The memory device of claim 18, wherein the at least one parameter includes a pulse width parameter for controlling either the width or magnitude of the pulse signal.

20. The memory device of claim 17, wherein the at least one first power circuit comprises:

a driver, for receiving a pulse signal and driving the pulse signal to a pulse control circuit;

a pulse control circuit, coupled to receive a control signal, the pulse control circuit receiving the driven pulse signal and configured to alter at least one parameter of the driven pulse signal in accordance with a state of the control signal; and a capacitor electrically coupled to the pulse control circuit, for storing charges received from the altered driven pulse signal, and for providing the first reference power signal based on the stored charges.

* * * * *